US012506242B2

(12) United States Patent
Fruehling et al.

(10) Patent No.: US 12,506,242 B2
(45) Date of Patent: Dec. 23, 2025

(54) COUPLING INTERFACES FOR WAVEGUIDE STRUCTURES AND METHODS OF FABRICATION

(71) Applicant: TEXAS INSTRUMENTS INCORPORATED, Dallas, TX (US)

(72) Inventors: Adam Joseph Fruehling, Plano, TX (US); Juan Alejandro Herbsommer, Allen, TX (US); Bichoy Waguih Bahr, Allen, TX (US); Argyrios Dellis, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 642 days.

(21) Appl. No.: 17/587,373

(22) Filed: Jan. 28, 2022

(65) Prior Publication Data
US 2023/0246320 A1    Aug. 3, 2023

(51) Int. Cl.
*H01P 5/02* (2006.01)
*H01L 23/66* (2006.01)
*H01P 11/00* (2006.01)

(52) U.S. Cl.
CPC ............... *H01P 5/02* (2013.01); *H01L 23/66* (2013.01); *H01P 11/001* (2013.01); *H01L 2223/6627* (2013.01)

(58) Field of Classification Search
CPC .. H01P 5/02; H01P 11/001; H01P 1/08; H01P 11/002; H01L 23/66; H01L 2223/6627; G01C 5/06; B81B 3/001; B81B 3/007; B81B 3/0021; B81B 7/0025; B81B 3/0072; B81B 3/0013; B81B 2207/015; B81B 2201/0264; B81B 2203/019; B81B 2201/0257; B81B 2203/0127; B81B 2207/012; G01L 9/0054; G01L 9/0048; G01L 9/0042; H04R 19/04; H04R 31/003; H04R 19/005; H04R 7/18; H04R 1/04; H04R 7/06; H04R 7/10; H04R 1/2815; H04R 31/006; H04R 7/04; H04R 2201/003; H04R 2410/03; B81C 1/00158; B81C 1/00658; B81C 1/00952; B81C 2203/0728; B81C 2201/0133; B81C 2201/0132; H03H 9/605; H03H 9/54; H03H 9/13; H03H 9/105; H03H 3/02; H03H 9/589; H03H 9/205
See application file for complete search history.

(56) References Cited

U.S. PATENT DOCUMENTS

| | | | |
|---|---|---|---|
| 8,464,589 B2 * | 6/2013 | Lee | H04R 19/005 73/715 |
| 9,088,058 B2 | 7/2015 | Pettus et al. | |
| 10,364,144 B2 | 7/2019 | Herbsommer et al. | |
| 10,374,621 B2 | 8/2019 | Herbsommer et al. | |
| 10,526,196 B2 * | 1/2020 | Teng | B81B 3/007 |

(Continued)

*Primary Examiner* — Mouloucoulaye Inoussa
(74) *Attorney, Agent, or Firm* — Ming Wai Choy; Frank D. Cimino

(57) ABSTRACT

In a described example, an apparatus includes a first substrate having a first side, a second side, and a coupling interface across a portion of the first side. The coupling interface including an arrangement of subwavelength periodic structures formed in the first substrate. A second substrate is coupled to a portion of the second side of the first substrate to form a sealed cavity aligned with the coupling interface.

23 Claims, 12 Drawing Sheets

(56) References Cited

U.S. PATENT DOCUMENTS

| | | | |
|---|---|---|---|
| 2007/0138394 A1* | 6/2007 | Lane | G01J 5/0803 250/353 |
| 2008/0277672 A1* | 11/2008 | Hovey | G02B 1/118 257/E21.705 |
| 2010/0072561 A1* | 3/2010 | Lee | B81C 1/00246 257/E21.257 |
| 2010/0096714 A1* | 4/2010 | Nakatani | B81C 1/00595 257/419 |
| 2010/0193886 A1* | 8/2010 | Nakatani | H04R 19/04 257/416 |
| 2011/0241137 A1* | 10/2011 | Huang | H01L 27/0617 257/419 |
| 2012/0148071 A1* | 6/2012 | Dehe | H04R 1/005 216/13 |
| 2012/0207332 A1* | 8/2012 | Dehe | H04R 1/403 381/182 |
| 2012/0319217 A1* | 12/2012 | Dehe | B81C 1/00182 438/488 |
| 2012/0326249 A1* | 12/2012 | Rombach | H04R 31/00 257/416 |
| 2013/0069179 A1* | 3/2013 | Ishimoto | H04R 19/005 257/416 |
| 2013/0134528 A1* | 5/2013 | Nguyen | H01H 59/0009 257/415 |
| 2013/0161702 A1* | 6/2013 | Chen | B81C 1/00246 257/E27.006 |
| 2013/0264663 A1* | 10/2013 | Dehe | B81B 3/0051 257/416 |
| 2014/0239352 A1* | 8/2014 | Wang | B81C 1/00246 257/254 |
| 2014/0286509 A1* | 9/2014 | Sciutti | H04R 19/04 381/174 |
| 2015/0041930 A1* | 2/2015 | Kim | H04R 31/00 257/416 |
| 2015/0061048 A1* | 3/2015 | Escher-Poeppel | H04R 1/021 438/51 |
| 2015/0110309 A1* | 4/2015 | Park | B81B 3/0086 381/190 |
| 2015/0132880 A1* | 5/2015 | Hsieh | B81C 1/00158 438/53 |
| 2015/0369653 A1* | 12/2015 | Inoue | H04R 19/005 324/660 |
| 2016/0112785 A1* | 4/2016 | Yoo | H04R 7/26 381/369 |
| 2016/0150324 A1* | 5/2016 | Yoo | H04R 31/00 381/356 |
| 2016/0150326 A1* | 5/2016 | Yoo | H04R 31/00 381/174 |
| 2016/0241979 A1* | 8/2016 | Cho | H04R 1/04 |
| 2016/0286317 A1* | 9/2016 | Zhao | H04R 7/08 |
| 2017/0203961 A1* | 7/2017 | Chang | H04R 7/14 |
| 2017/0203962 A1* | 7/2017 | Cheng | B81B 7/0038 |
| 2017/0217755 A1* | 8/2017 | Matsuzawa | G01C 5/06 |
| 2018/0057351 A1* | 3/2018 | Yama | B81C 1/00984 |
| 2018/0122356 A1* | 5/2018 | Yoo | G10K 11/1787 |
| 2018/0317018 A1* | 11/2018 | Yu | H04R 19/04 |
| 2019/0058232 A1* | 2/2019 | Fruehling | H01P 7/065 |
| 2019/0071306 A1* | 3/2019 | Herbsommer | B81C 1/00047 |
| 2019/0074233 A1* | 3/2019 | Fruehling | B81C 1/00333 |
| 2019/0301956 A1* | 10/2019 | Tanaka | H04R 31/003 |
| 2019/0342672 A1* | 11/2019 | Cai | H04R 7/16 |
| 2020/0024134 A1* | 1/2020 | Jenkins | B81C 1/00158 |
| 2020/0112799 A1* | 4/2020 | Kuntzman | H04R 7/18 |
| 2020/0112800 A1* | 4/2020 | Lee | H04R 19/005 |
| 2020/0186940 A1* | 6/2020 | Sun | H04R 7/04 |
| 2020/0196065 A1* | 6/2020 | Pedersen | H04R 19/005 |
| 2021/0029470 A1* | 1/2021 | Nawaz | G01L 9/0072 |
| 2021/0067882 A1* | 3/2021 | Rombach | H04R 3/005 |
| 2021/0070610 A1* | 3/2021 | Lee | G01L 9/0048 |
| 2021/0144482 A1* | 5/2021 | Piechocinski | B81B 3/0021 |
| 2021/0204068 A1* | 7/2021 | Wang | B81B 3/0054 |
| 2021/0204069 A1* | 7/2021 | Wang | B81B 3/0078 |
| 2021/0258700 A1* | 8/2021 | Kervran | G02B 26/0825 |
| 2021/0274287 A1* | 9/2021 | Naderyan | H04R 7/26 |
| 2022/0020892 A1* | 1/2022 | Aliane | H01L 31/1136 |
| 2022/0116715 A1* | 4/2022 | Ho | H04R 19/005 |
| 2022/0150645 A1* | 5/2022 | Lee | H04R 1/04 |
| 2022/0227618 A1* | 7/2022 | Teng | B81B 3/001 |
| 2022/0368310 A1* | 11/2022 | Luo | H03H 9/605 |
| 2022/0369013 A1* | 11/2022 | Niederberger | H03F 3/45475 |
| 2022/0386052 A1* | 12/2022 | Su | H04R 19/04 |

* cited by examiner

COUPLING INTERFACES FOR WAVEGUIDE STRUCTURES AND METHODS OF FABRICATION

TECHNICAL FIELD

This description relates to coupling interface, waveguide structures and methods of fabricating the structure.

BACKGROUND

There are various types of coupling interfaces configured to transition into cavity waveguides. Some example coupling interfaces include stepped transitions, thick dielectric (e.g., glass) slabs or probes/antennas to communicate signals to or from a waveguide cavity. These and other existing coupling interfaces typically use glass wafer bonded to a metal layer formed on a silicon wafer, which can be expensive to manufacture and/or result in leakage.

SUMMARY

In a described example, a method includes forming a coupling interface at a first surface of a first substrate, in which the coupling interface includes three-dimensional periodic structures. The method also includes forming a cavity in at least one of a second surface of the first substrate or in a second substrate. The method also includes bonding the second substrate to the second surface of the first substrate to form a seal around the cavity, in which the coupling interface is aligned with the cavity and configured to propagate incident electromagnetic waves through the periodic structures into the cavity.

In another described example, an apparatus includes a first substrate having a first side, a second side, and a coupling interface across a portion of the first side. The coupling interface including an arrangement of subwavelength periodic structures formed in the first substrate. A second substrate is coupled to a portion of the second side of the first substrate to form a sealed cavity aligned with the coupling interface.

In a further described example, an apparatus includes a first semiconductor substrate having a first side, an opposite second side, and a first cavity portion formed in the second side. The first cavity portion has sidewalls extending between the second side and an inner end wall of the first cavity portion, and a coupling interface is aligned with the first cavity portion. The coupling interface includes first self-terminating, subwavelength periodic structures formed in the first side of the first substrate and second self-terminating, subwavelength periodic structures formed in the second side of the first substrate. A second semiconductor substrate has a first side, an opposite second side, and a second cavity portion formed in the second side. The first cavity portion has sidewalls extending between the second side and an inner end wall of the second cavity portion. The second side of the second substrate is coupled to the second side of the first substrate to seal the first and second cavity portions.

DETAILED DESCRIPTION

Figure 1:
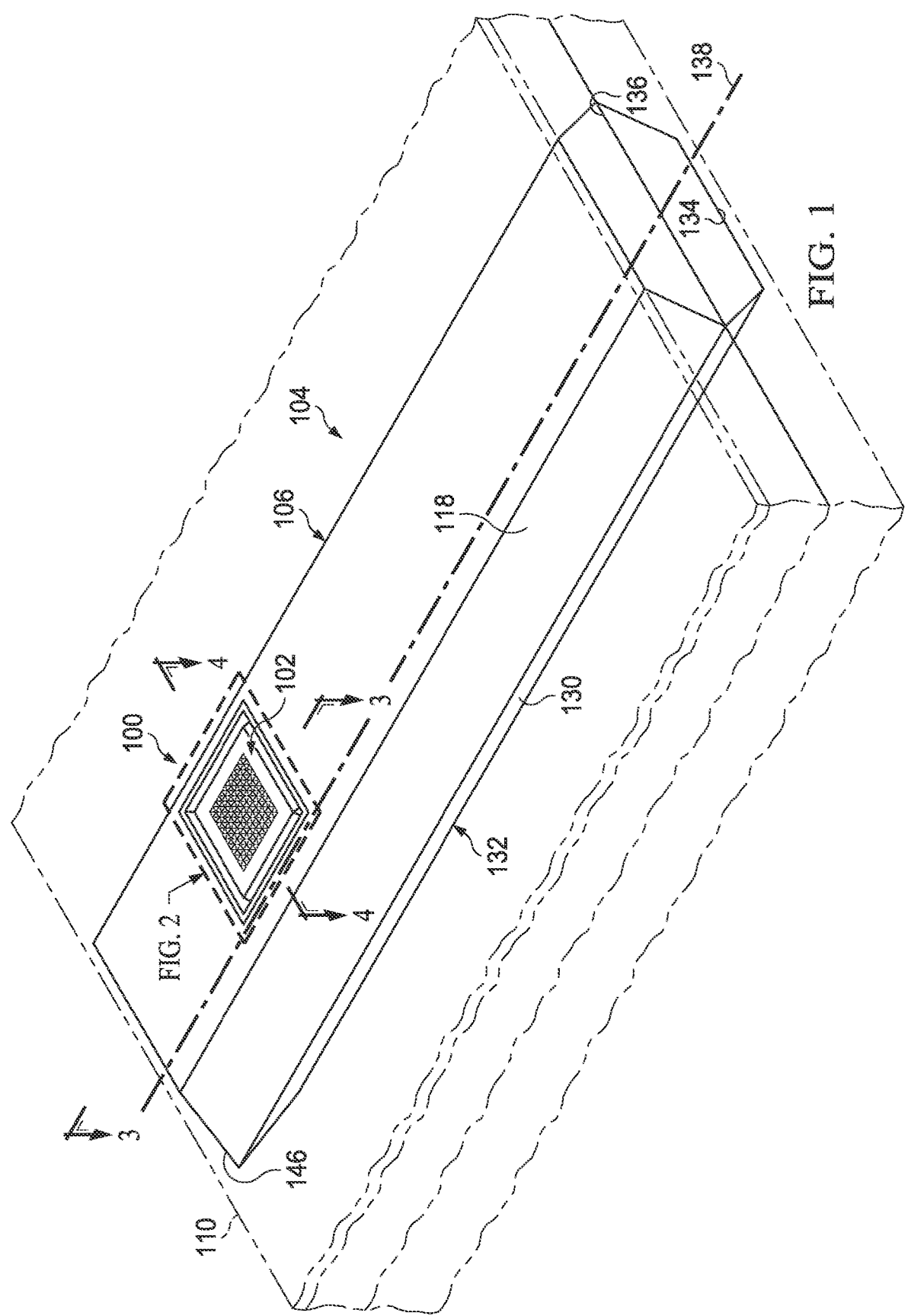
FIG. 1 is a perspective view showing a coupling interface configured to provide a transition into a waveguide cavity.
Figure 2:
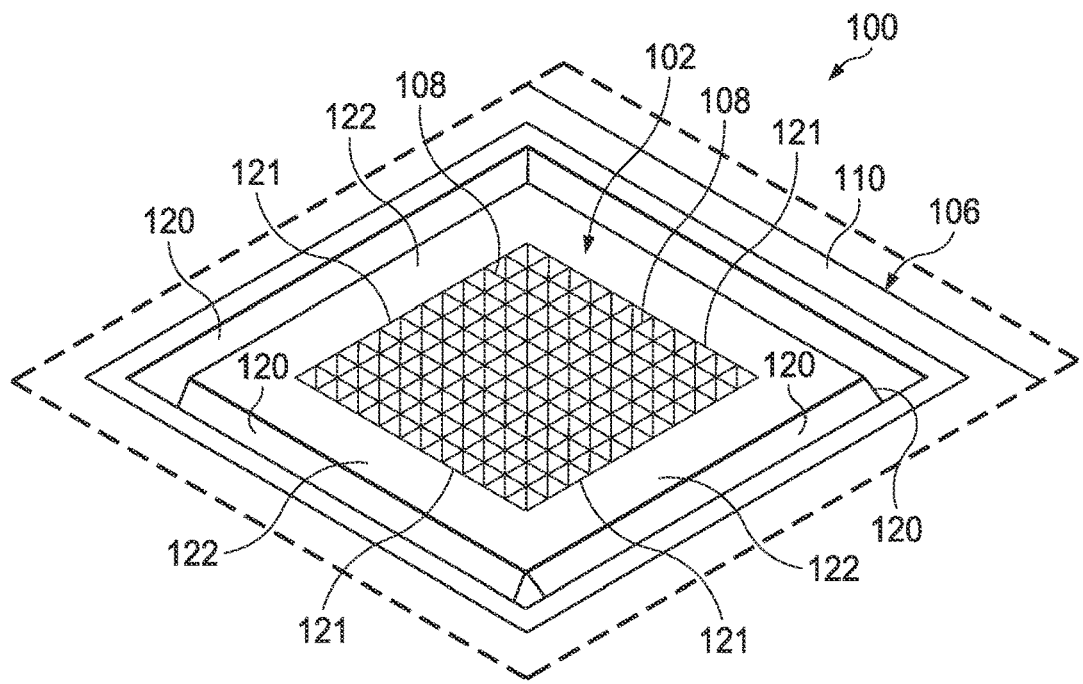
FIG. 2 illustrates an enlarged view of the coupling interface of FIG. 1.

Example embodiments relate to coupling interfaces for waveguide structures and to methods of fabricating the coupling interface and waveguide structures. For example, the coupling interface includes a three-dimensional periodic structure formed (e.g., by patterning and etching) on a first surface of a substrate (e.g., a silicon wafer) to provide a coupling interface for transitioning into a waveguide cavity. The coupling interface can also include blocking structures (e.g., electromagnetic bandgap structures) formed along the periphery of the coupling interface to reduce or prevent lateral propagation of surface waves through the wafer. In an example, a portion of the cavity can be formed into a second surface of the wafer aligned with and opposing the coupling interface. The cavity can be sealed along the second surface of the wafer by a second wafer. For example, another portion of the cavity can be formed in the second wafer commensurate in size with the portion of the cavity formed in the first wafer. In another example, the coupling interface is formed along the surface of a first, substantially flat wafer, which itself includes no cavity, and the flat wafer is bonded to a second wafer in which the cavity is formed. In each example, the two wafers can be bonded together (e.g., silicon-to-silicon or metal-to-metal bonding) to form a hermetic seal along a boundary of the cavity. In an example, the cavity is a gas or physics cell that contains a low pressure gas of dipolar molecules that, when excited with electromagnetic waves at the proper frequency, transition from a lower energy quantum rotational state to a higher energy quantum rotational energy. The coupling interface is configured to provide impedance matching and anti-reflective region along a direction of travel for an incident wave and thereby improve transmission efficiency into the cavity.

As described herein, the coupling interface can eliminate the need for glass bonding to a silicon wafer as well as reduce the effective dielectric constant of Si in a local region to enable low-loss signal propagation into the cavity. The bonding between wafers further can reduce or eliminate the dominant leak path and enable additional surface routing circuit integration on the wafer, such as for system on chip (SOC) component integration. Also, the coupling interface can reduce the effective dielectric constant of the silicon wafer to allow low loss propagation and limit reflection of the traveling wave. As a result, overall transmission efficiency into the cavity can be improved and with a decreased cost compared to many existing coupling interfaces.

FIGS. 1-4 show various views of an example apparatus 100 including a coupling interface 102 configured and arranged to provide a transition for electromagnetic waves into a cavity 104 of a waveguide 106. For example, the cavity 104 is a hermetically sealed gas cell or physics cell configured to contain a volume of gas molecules at low pressure. The pressure within the waveguide cavity 104 can be about 0.5 mbar or less, depending on the gas within the cavity. The gas molecules (e.g., water or $H_2O$, OCS, ammonia, etc.) have defined quantum rotational state transitions, and such molecules absorb energy at a very repeatable frequency when transitioning between rotational states.

The coupling interface 102 includes an arrangement of three-dimensional periodic structures 108 formed at a respective surface 110 of a substrate 112 (e.g., a silicon wafer). The periodic structures 108 are also referred to herein as first periodic structures or first structures. The periodic structures 108 can be self-terminating, sub-wavelength structures. Each of the periodic structures has an opening at the surface 110 configured (e.g., having a width or diameter) to be less than a wavelength of target incident electromagnetic waves. The structures are considered periodic as the structures are arranged and configured in repeating pattern of respective structures across the substrate 112, such as a two-dimensional array of such periodic structures in the coupling interface. The array can include the same number of structures in each row and column, and each structure can be substantially the same size. Alternatively, the array can have a different number of rows from the number of columns. Although a variety of methods can create these periodic dielectric transition structures, when coupled with anisotropic etching of silicon, the lithographic pattern can be defined so that when the crystallographic planes intersect the etch will rate limit to near-zero (see, e.g., FIG. 18), reducing process sensitivity compared to an isotropic approach (see, e.g., FIG. 19). Unless otherwise stated, in this description, "about," "approximately" or "substantially" preceding a value means +/−5 percent (5%) of the stated value. For example, "substantially parallel" means being within +/−4.5 degrees of exactly parallel, and "substantially the same size" means being within +/−5% of being exactly the same size. By including construction for the periodic structures 108 in the coupling interface 102, the effective dielectric constant ($\varepsilon_r$) of the substrate in a local region of the coupling interface is reduced to enable low-loss signal propagation into the cavity 104.

As a further example, the substrate 112 is a wafer of silicon (e.g., bulk or grown) having a known crystal orientation (e.g., a (001) crystal orientation). In other examples, a material other than silicon can be used as the substrate 112. In a silicon wafer substrate 112, the periodic structures 108 can be formed using silicon-based processing techniques. In an example, the periodic structures 108 are formed by etching into the first surface 110 of the wafer substrate 112. In another example, as described below, periodic structures 116 are formed by etching into a second surface 114 of the wafer substrate 112, in which the second surface is opposite to and substantially parallel with the first surface 110. In yet another example, the periodic structures 108 include an arrangement of interdigitated structures formed by etching both into the first surface 110 and the second surface of the wafer substrate 112.

As a further example, the periodic structures 108 are etched in the silicon wafer using isotropic (e.g., DRIE, $XeF_2$, $SF_6$, $CHF_3$) or anisotropic etching, such as using potassium hydroxide (KOH), tetra-methyl ammonium hydroxide (TMAH), or Ethylene Diamine Pyrochatechol (EDP) (e.g., TMAH, EDP, or KOH in a wet etching process). For the example of a silicon substrate having a (100) crystal orientation, wet etching with TMAH can be used to form the periodic structures provide an angle between the sidewalls and the surface plane of about 54.7 degrees. As a result of using such etching into the substrate 112 through a square-shaped (e.g., checker board) patterned resist on the substrate surface 110, the periodic structures can be formed using an anisotropic etch to provide each of the periodic structures a respective 3D pyramidal shape. For example, each self-terminating periodic structure has a rectangular base at the first surface 110 with triangular sidewalls extending from the first surface angled toward each other at known angles (e.g., about 54.7 degrees), which angles depends on the etching, to terminate in a point. The angle and length of the sidewalls can vary depending on the etching method. In other examples, the periodic structures 108 can also be formed with different sidewall angles, which angles can depend on the crystal orientation of the wafer or other substrate 112 and/or the etching process used to form the respective structures. Thus, different wet or dry etching processes (e.g., plasma etching) can be used to form the periodic structures 108. For example, an isotropic etch can be used to form the 3D periodic structures with a hemispherical shape (see, e.g., FIG. 19) into the substrate surface.

The cavity 104 includes a first cavity portion 118 formed in the substrate 112, such as by etching into the second surface 114 of the substrate 112 during backside processing. The first cavity portion 118 can extend a depth into the second surface according to the duration and type of etching. The cavity portion 118 thus has an end wall 117 that extends between distal ends of respective sidewalls 119 adjacent the surface 110. The sidewalls 119 have respective angles with respect to a virtual plane extending orthogonally with respect to the surface 114 (e.g., along crystal plane (100)). The sidewall angle depends on the wafer crystal orientation and etching technique, such as described herein. In an example, a timed wet etching with TMAH through a patterned mask is used to form the cavity portion 118 in the second surface 114.

Figure 4:
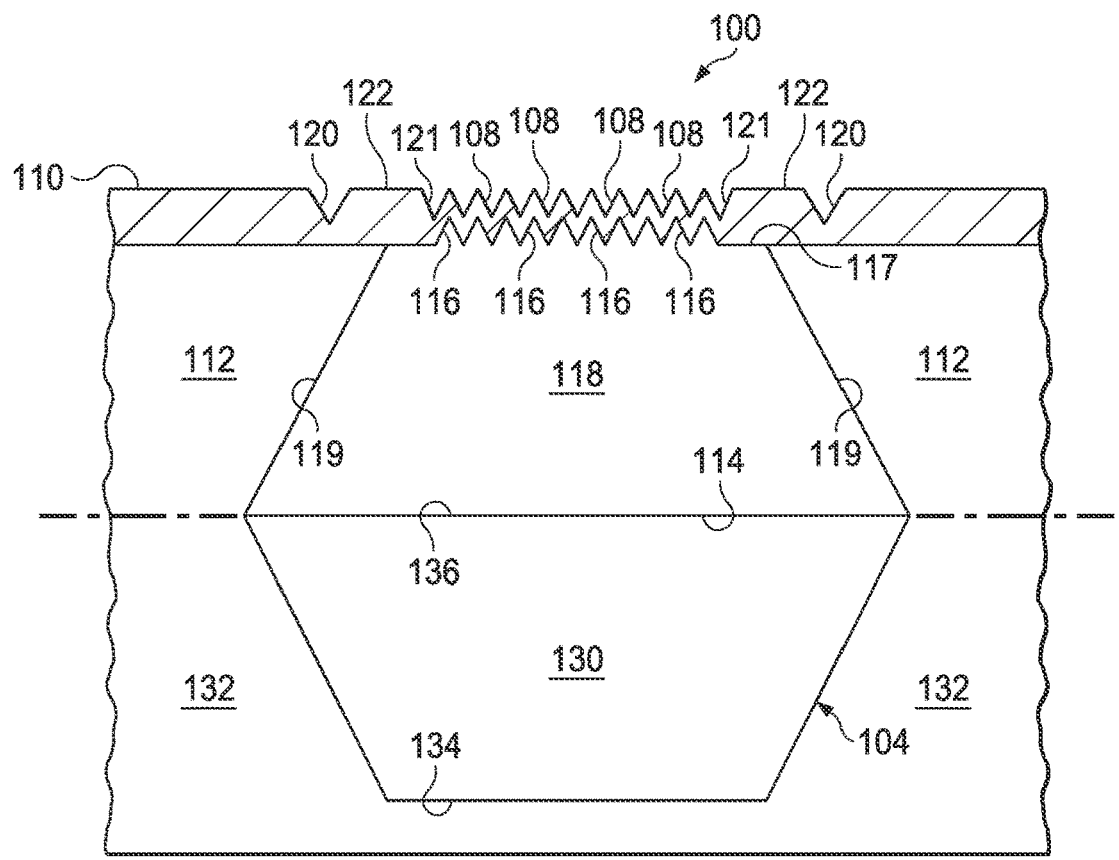
FIG. 4 is a cross-sectional view of the waveguide cavity of FIG. 1 taken along line 4-4.

In a further example, the coupling interface 102 includes second periodic structures 116 formed into the second surface 114 through the cavity portion 118. For example, the second periodic structures 116 can be formed in the end wall 117 to be interdigitated with respective first periodic structures 108, such as shown in FIG. 4. In an example, the second periodic structures are formed in the end wall using the same etching technique and etch time as is used to form the first periodic structures 108. The periodic structures 116 thus can have pyramidal shaped sidewalls at known angles for anisotropic methods, which shape and angles can be the same or different from first periodic structures, or in the case of isotropic techniques, can have conical, cylindrical, rectangular, hemispherical shaped sidewalls. As described above, one of the periodic structures 108 or 116 can be omitted from the coupling interface 102 so the interface includes only structures 108 or the structures 116. In another example, the coupling interface 102 includes the arrangement of interdigitated structures 108 and 116 formed by etching both into the first surface 110 and the second surface of the wafer substrate 112. An anti-reflective coating and/or reinforcement layer can be applied over one or both of the structures 108 and 116.

In a further example, the coupling interface 102 also includes blocking structures 120 along a periphery 121 of the array of periodic structures 108. For example, the blocking structures 120 are etched in into the first surface 110 of the substrate 112 to provide respective trenches along each side of the coupling interface 102. In an example, the blocking structures are formed using the same mask and etching steps as used when forming the periodic structures 108. Because the width of the blocking structures is greater than the structures 108, the trenches extend into the substrate a greater depth than the respective structures 108 (e.g., for the same time etch and etchant).

In an example, the blocking structures 120 are spaced outwardly from an outer periphery of the periodic structures 108 so an intermediate portion of the surface 110 extends between and separates the blocking structures from the periphery. The coupling interface 102 can also include a conductive (e.g., metal) layer along the inner (etched) surface of the blocking structures 120 as well as on the intermediate portion of the surface 110 to further reduce or prevent lateral propagation of incident waves across the wafer. The conductive layer on the intermediate portion of the surface 110 forms am iris 122. In some examples, electromagnetic bandgap (EBG) structures can be formed on the surface 110 surrounding the blocking structures 120, such as described herein (see, e.g., FIGS. 8-12). The conductive layers forming an iris, the conductive layer on the blocking structures 120 and the EBG structures can be formed collectively over common processing steps.

In the example of FIGS. 1-4, the cavity 104 also includes a second cavity portion 130 formed in a second substrate 132. The second substrate 132 has first and second opposite surfaces 134 and 136. For example, the second cavity portion 130 is formed in the first surface 134 of the substrate 132 using an etching method, such as the same etching method used to form the first cavity portion 118 in substrate 112. The second substrate 132 can be coupled to the first substrate 112 so the first and second cavity portions 118 and 130 are aligned to provide a hermetically sealed cavity 104 for the waveguide 106. The first and second cavity portions 118 and 130 thus can have the same size and shape. The first and second cavity portions 118 and 130 can be co-extensive along a longitudinal axis 138 of the waveguide 106. Also, the first and second cavity portions 118 and 130 can have the same width at their respective adjacent surfaces 114 and 136. In another example, the second cavity portion 130 is omitted from the second substrate 132, and the second substrate 132 can be coupled to the first substrate 112 so the cavity portion 118 and a portion of the surface 136 (e.g., a substantially flat surface) form substantially the entire cavity 104 for the waveguide 106.

Figure 3:
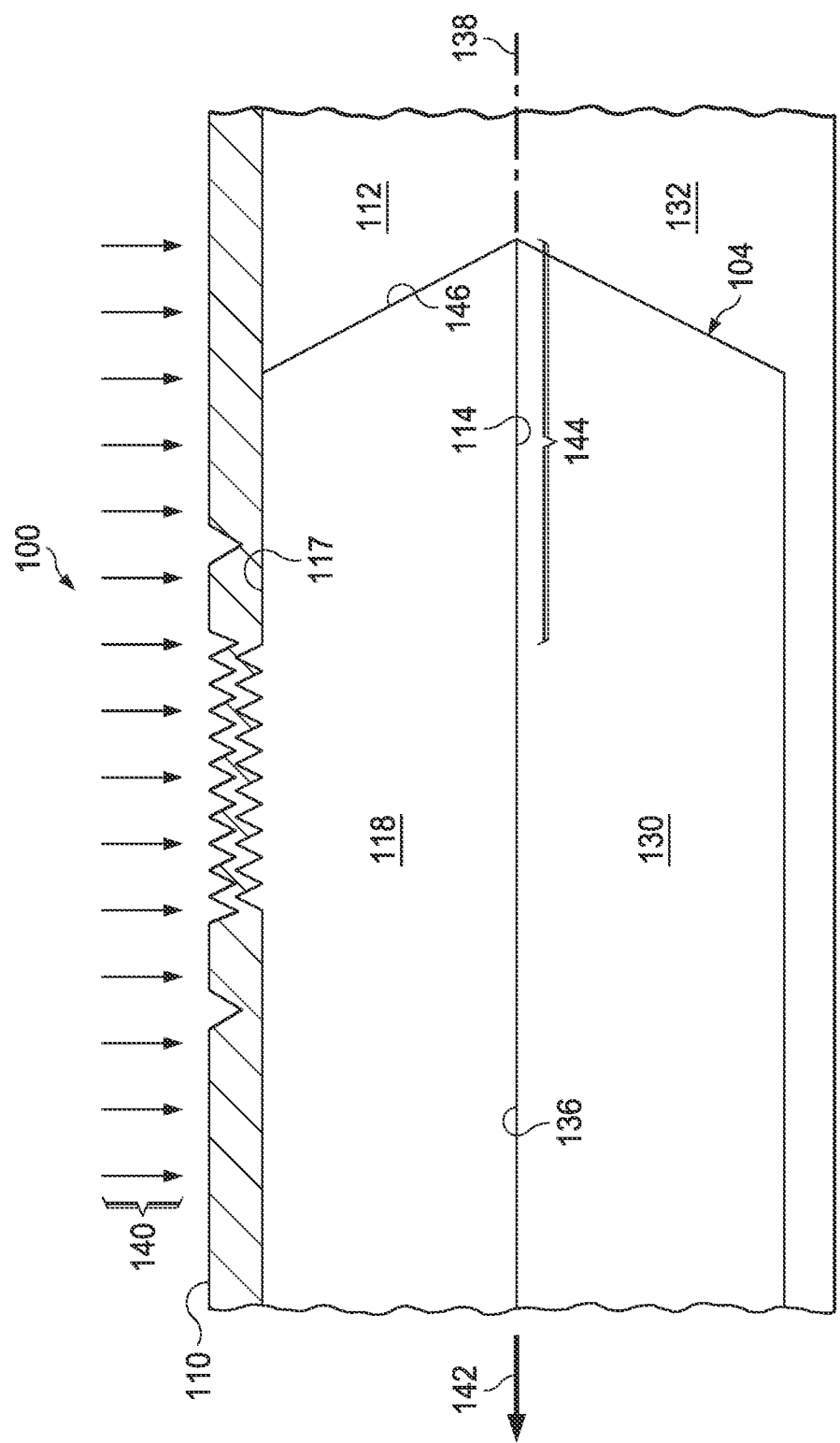
FIG. 3 is a cross-sectional view of the waveguide cavity of FIG. 1 taken along line 3-3.

In an example where the substrates are silicon (e.g., silicon wafers) 112 and 132, the substrate surfaces 114 and 136 can be bonded together by known wafer bonding methods. As one example, the substrate surfaces 114 and 136 are formed of silicon and bonded using wet activated or plasma activated fusion bonding techniques. In another example, in which a metal layer is formed on the respective surfaces 114 and 136, the substrate surfaces are bonded using thermocompression or eutectic wafer bonding techniques. In other examples, different bonding techniques could be used to couple the wafer substrates. When the substrates 112 and 132 are bonded together, peripheries of the cavity portions 118 and 130 are aligned with each other. Also, the cavity portions 118 and 130 are arranged and configured substantially symmetrically on opposite sides of a virtual plane extending along the juncture between adjacent surfaces 114 and 136, such as shown in FIGS. 3 and 4. As a result of bonding the substrates 112 and 132, a hermetic seal can be formed around the cavity 104 resulting from the cavity portions 118 and 130.

In an example, a volume of gas molecules (e.g., water or $H_2O$, OCS, ammonia etc.) can be sealed within the cavity 104 at a desired low pressure. The coupling interface 102, is configured to propagate incident electromagnetic waves, shown at 140 in FIG. 3, into the waveguide cavity 104 and in a direction, shown at 142, through the cavity. In an example, the waveguide 106 includes a radiofrequency (RF) backstop 144 within the cavity 104 adjacent the proximal end 146 of the waveguide, such as at a longitudinal location between the coupling interface 102 and the end of the waveguide. The RF backstop 144 is configured to optimize the insertion loss and reduce the return loss of the interface 102. The distance 144 can be approximately lambda/2, where lambda is the wavelength of the electromagnetic signal inside the waveguide. The electromagnetic waves propagating through cavity interact with the gas molecules within the cavity. For example, the gas molecules absorb energy at a repeatable frequency when transitioning between rotational states responsive to the electromagnetic waves propagating through cavity. For example, water absorbs energy based on quantum rotational state transitions at 183.31 GHz.

In a further example, there can be any number of one more instances of the waveguide 106 fabricated on the silicon substrates 112 and 132 using semiconductor-based processes. The resulting apparatus can be combined with, or interconnected with, simple additional circuitry (e.g., a transceiver) to implement a cost effective and power efficient transitions. For example, the apparatus is an atomic clock that can be configured to operate at a broadband range of frequencies, including at higher frequencies (e.g., greater than about 60 GHz), by configuring the size of the periodic structures 108 and/or 116 accordingly.

Figure 5:
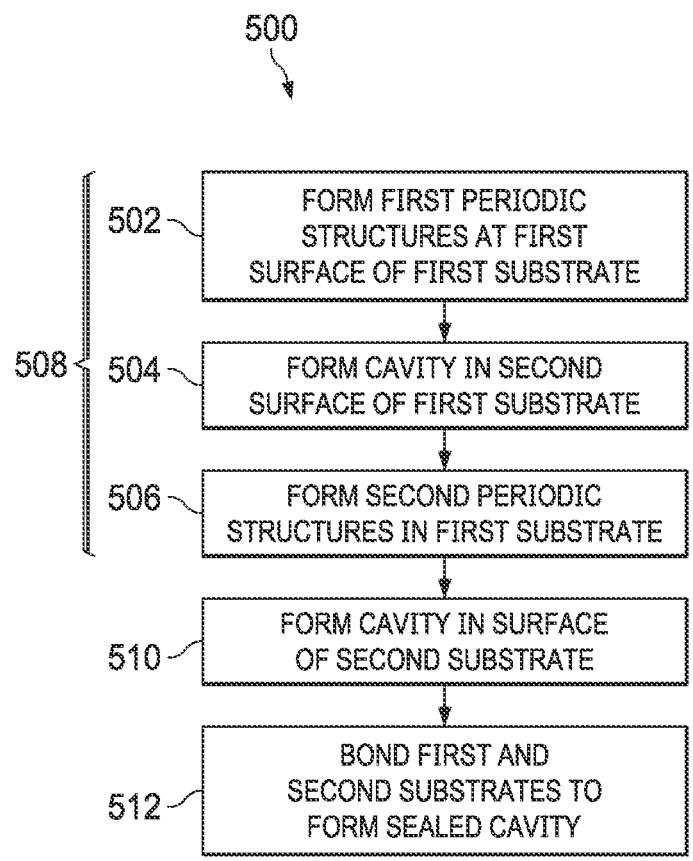
FIG. 5 is flow diagram of an example method to fabricate a coupling interface.

FIG. 5 is a flow diagram showing an example method 500 of making an apparatus (e.g., the apparatus 100). The method 500 is described in relation to the cross-sectional views of FIGS. 6-16, which show an example processing progression for forming an example apparatus (e.g., waveguide structure) including an integrated coupling interface. The description of FIGS. 5-16 also refers to the apparatus shown in FIGS. 1-4, which show an example apparatus that can be formed according to the method 500.

Figure 8:
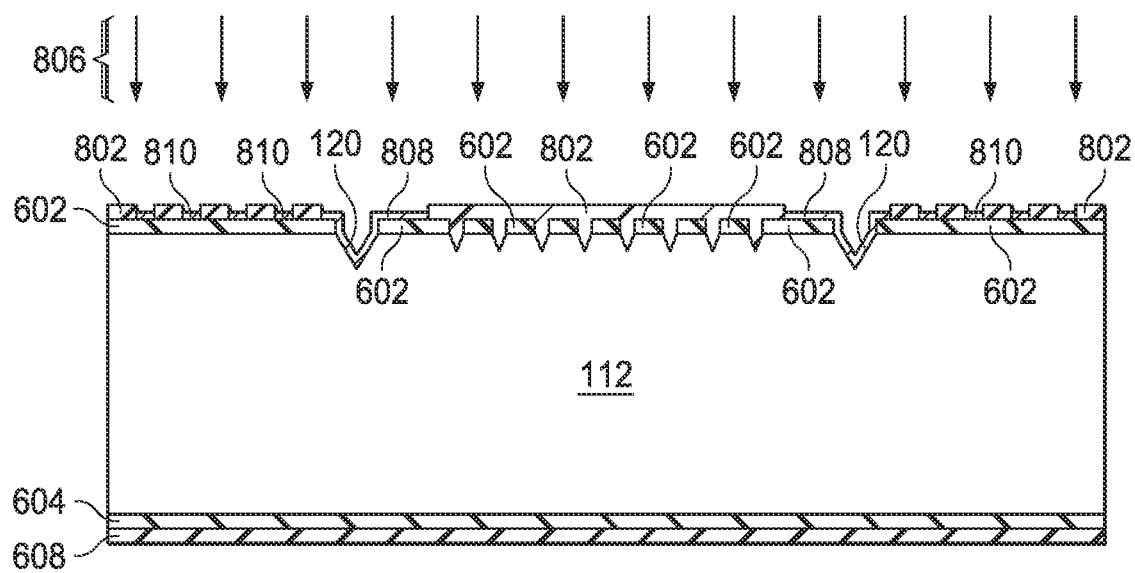

The method 500 includes forming first periodic structures at a first surface of a first substrate. For example, as shown in FIG. 8, the substrate 112 includes top and bottom oxide layers 602 and 604 on respective surfaces 110 and 114 of the substrate 112. Nitride layers 606 and 608 can be formed over the oxide layers 602 and 604, respectively. The oxide and nitride layers 602, 604, 606 and 608 provide hard masks configured to protect respective surfaces 110 and 114 of the substrate 112. Also shown in FIG. 6, a patterned mask of a photoresist layer 610 is formed over the top nitride layer 606.

Figure 7:
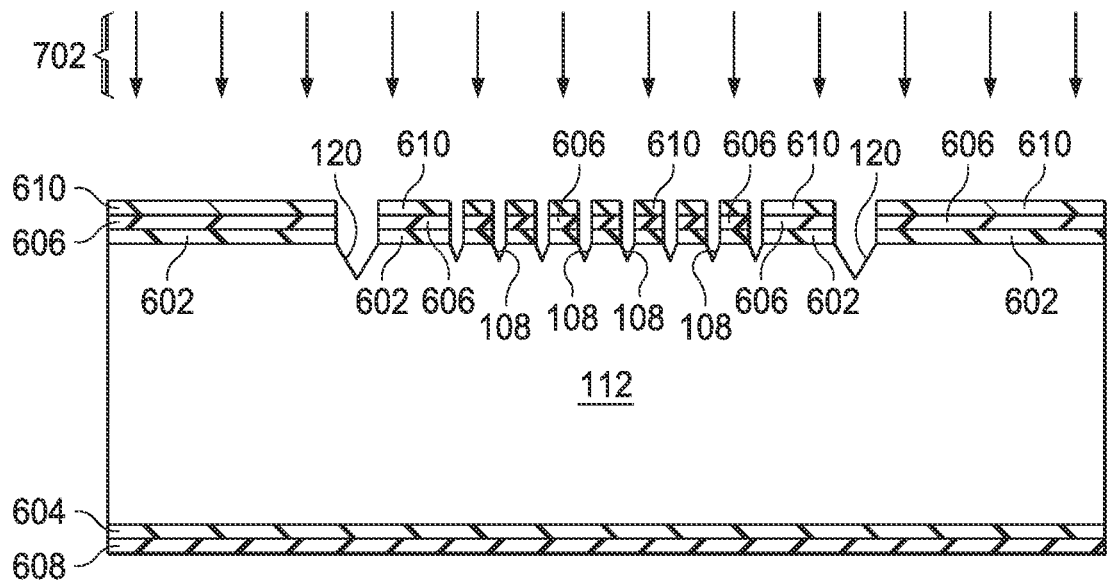

As shown in FIG. 7, the periodic structures 108 are formed in the substrate 112 by etching, shown at 702. The etching 702 can be implemented using a TMAH etching technique, such as described herein. Other etching techniques can also be used (e.g., KOH or dry etching techniques). The etching 702 can also be implemented to form respective blocking structures 120 along the periphery of the periodic structures 108. The blocking structures 120 can be formed as trenches extending from the surface 110 into the substrate 112 a depth that is greater than the depth of the periodic structures 108.

Also, in some examples, as shown in FIG. 8, another patterned mask layer 802 (e.g., of photoresist) can be formed over the periodic and blocking structures 108 and 120, shown at 802. The patterned mask layer 802 is configured to form a conductive layer through the mask 802. For example, the conductive layer can be applied through the mask, such as by deposition of a conductive material, shown at 806 (e.g., chemical vapor deposition (CVD), such as plasma-enhanced CVD (PECVD)). As an example, the conductive layer can include gold, copper, aluminum, or silver, which can be combined with one or more layers of an adhesive material, such as titanium or chromium or other suitable materials. The applied conductive layer thus can form an iris 808 and an EBG structure 810. The conductive layer can also extend over and onto the sidewalls of the blocking structures 120. For example, the iris 808 is formed around the periphery 121 of the array of periodic structures 108, and the metal lined blocking structures 120 surround the iris. The EBG structure 810 surrounds the blocking structures 120 along the surface of the substrate. The mask layer 802 can be configured to form the EBG structure. The EBG structure is an arrangement of periodic metallic elements of a defined geometry configured to create a High Impedance Surface (HIS). The HIS impedes the propagation of electromagnetic waves in a particular frequency band of interest. In an example, the EBG structure 810 includes hollow squares patterned in the metal or the dielectric. Other configurations can be used to from the EBG structure 810, such as a Sievenpiper mushroom, such as can be square, circular, rectangular, hexagonal, or other shapes. The mask layer 802 covers the periodic structures formed at 502 to prevent metal from being applied along the sidewalls of the respective periodic structures 108.

Figure 6:
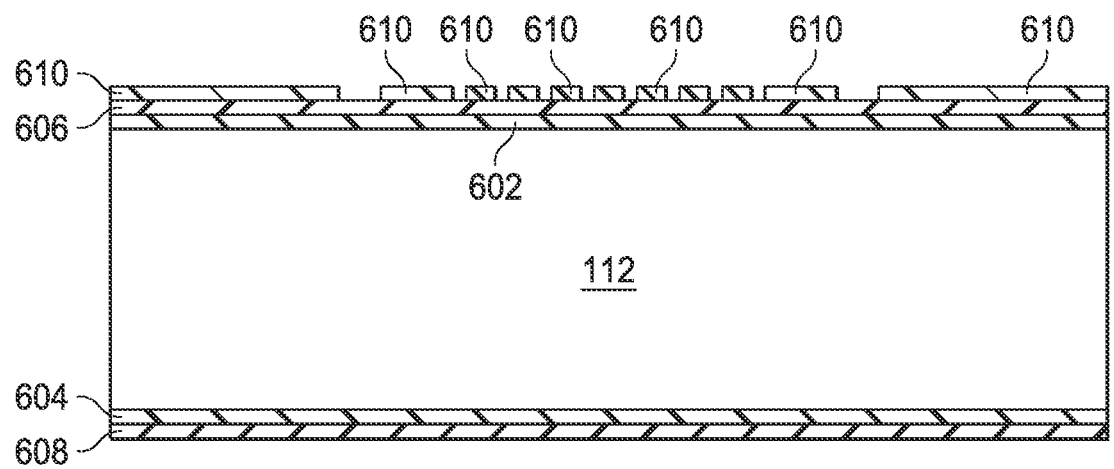
FIGS. 6-16 are cross sectional views of a coupling interface at various steps of the fabrication method of FIG. 5.
Figure 9:
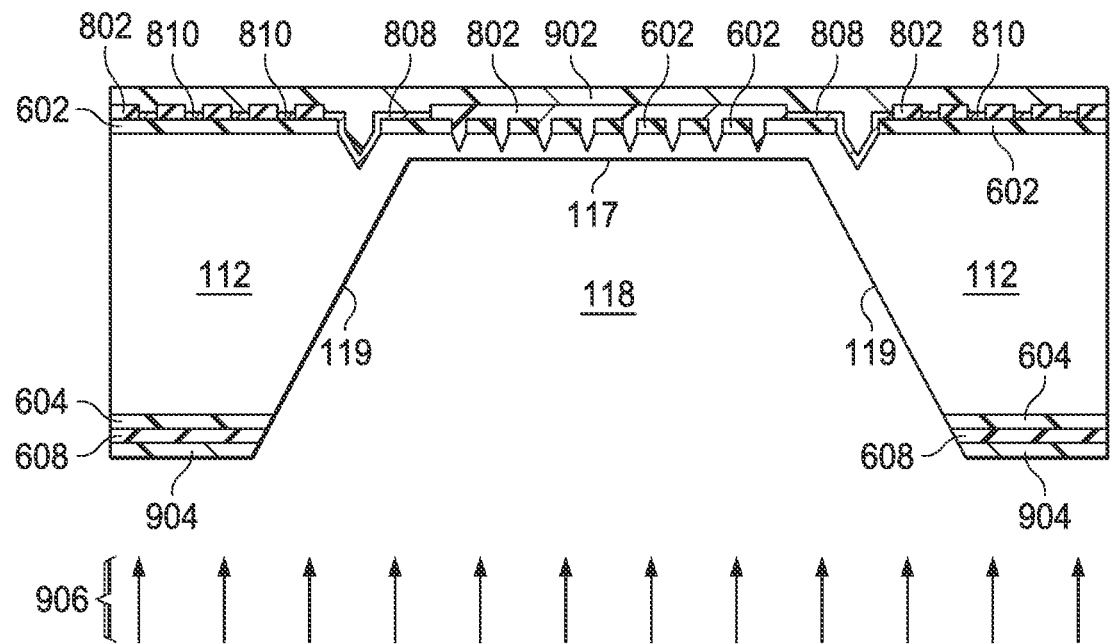

Referring back to FIG. 5, at 504, the method 500 includes forming a cavity in a second surface in the first substrate. In some examples, prior to forming the cavity, a protective mask 902 (e.g., of photoresist) can be applied over the first surface 110 to shield the features formed at 502, such as shown in FIGS. 6, 7 and 8. As shown in FIG. 9, patterned mask layer 904 (e.g., of nitride, oxide and/or photoresist) can be applied to the bottom side of the substrate 112 to expose the region where the cavity is to be formed. The respective cavity 118 can be formed in the second surface 114 of the substrate 112 by an etching process, shown at 906 (e.g., TMAH or other etching). The resulting cavity 118 thus includes respective sidewalls 119 that extend from the surface 114 to an end wall 117 that is spaced from the first surface 110 of the substrate 112 as described herein. In other examples, the cavity can be omitted from the first substrate, such as when the periodic structures (e.g., silicon windowing) are formed on a substantially flat (thin) wafer having a thickness that approximates (or is slightly thicker than) the thickness of the periodic structures.

Figure 10:
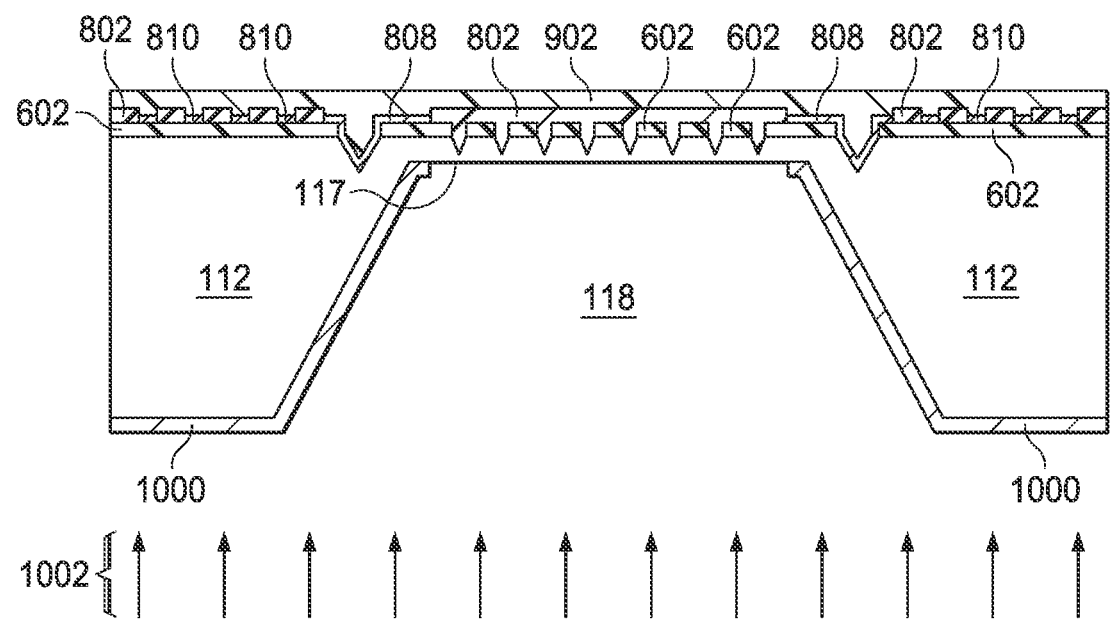
Figure 11:
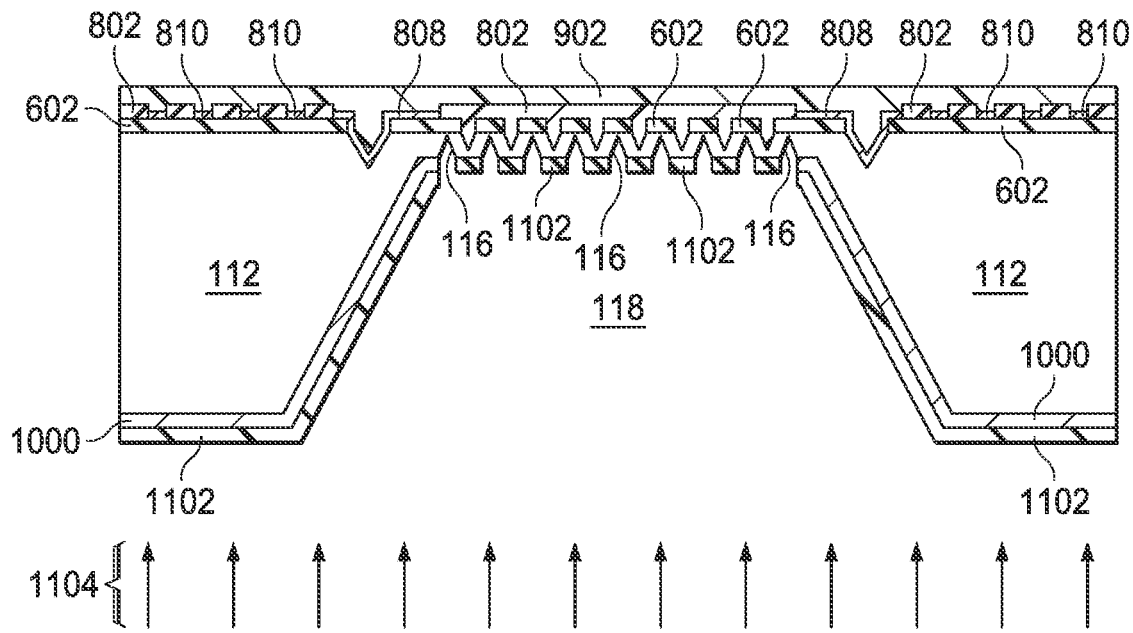

As shown in FIG. 10, a bottom side conductive layer 1000 is formed on the sidewalls 119 of the cavity 118 as well as on the surface 114, such as by a deposition process shown at 1002. For example, the deposition can be implemented as a blanket deposition of multiple layers of a conductive material, such as titanium, gold and/or another conductive material (e.g., about 30 nm Ti and about 1 µm Au). Also, prior to deposition at 1002, the nitride and oxide layers 604 and 608 can be removed (e.g., by etching, polishing or another removal technique), and the end wall 117 can be masked off so the conductive layer 1000 is not applied to the end wall. Alternatively, the metal layer can be applied to end wall can be deposited with the conductive layer 1000 and later removed (e.g., by etching or polishing).

Returning to FIG. 5, at 506, the method 500 includes forming second periodic structures in the first substrate 112. As described herein, in some examples, the second periodic structures could be omitted (see, e.g., FIG. 23). For example, a hard patterned mask layer (e.g., a layer of silicon nitride) 1102 is applied onto the conductive layer 1000 and along the end wall 117 of the cavity 118. Second periodic structures 116 are formed in the end wall 117 through the mask layer 1102, such as by an etching process shown at 1104. For example, the etching process 1104 is implemented as a TMAH etch process through the hard patterned mask 1102 to form the period structures 116 interdigitated among the first periodic structures 108. Other etching techniques can also be used. The remaining photoresist may be cleaned (e.g., stripped) away to provide a respective first wafer structure, such as shown at 1200 in FIG. 12.

Referring back to FIG. 5, a first part of the method 500, shown at 508, thus can be used to form the first wafer apparatus 1200. The method 500 also includes forming a second wafer structure, (see, e.g., wafer structure 1500 in FIG. 15). For example, at 510, the method 500 includes forming a cavity in a surface of a second substrate.

Figure 13:
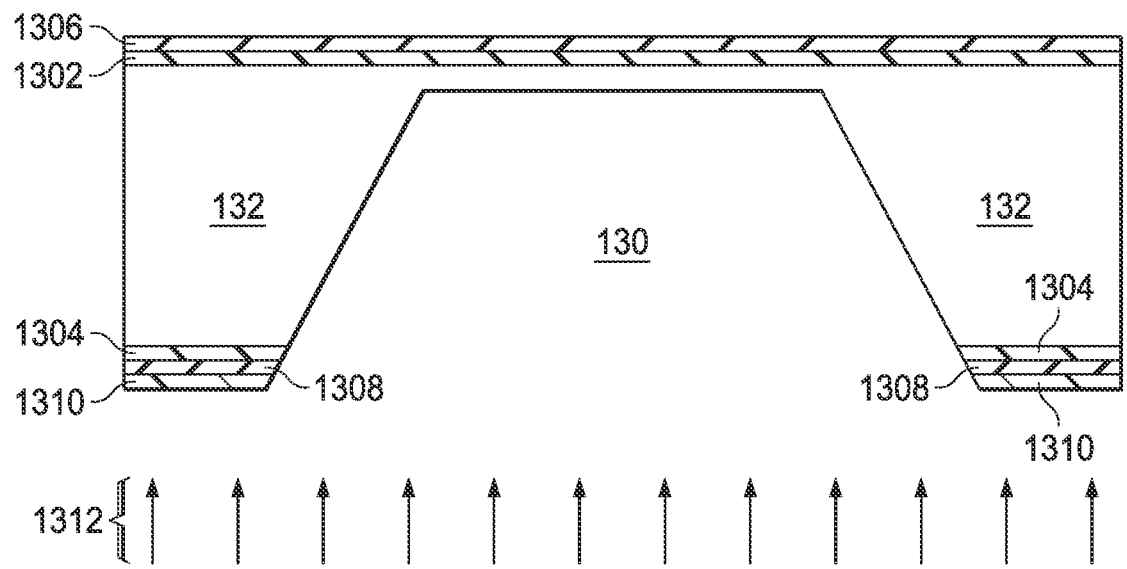
Figure 14:
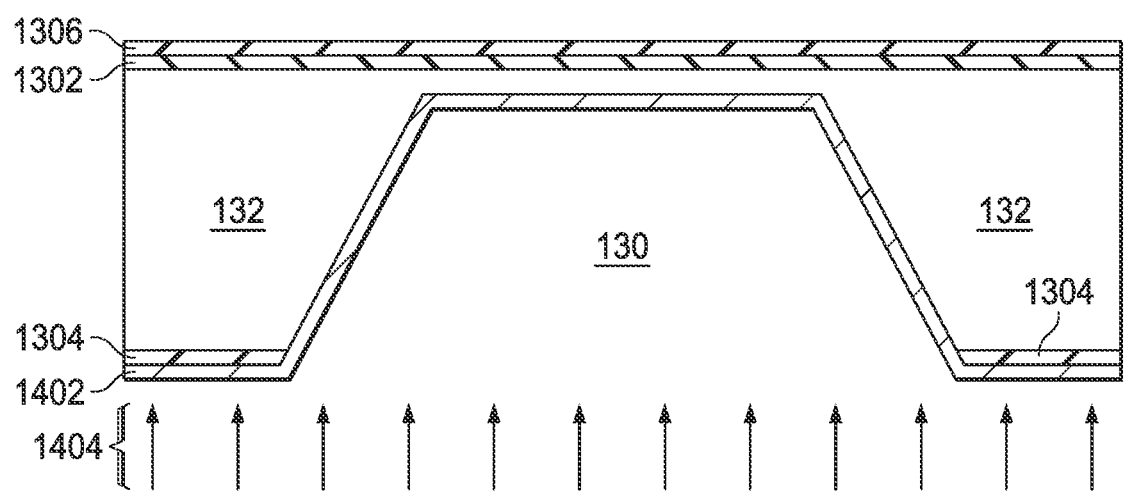

As shown in FIG. 13, the substrate 132 can be prepared similar to the substrate 112, such as by applying oxide layers 1302 and 1304 to respective surfaces 136 and 134 of the substrate 132. Nitride layers 1306 and 1308 can also be applied over respective oxide layers 1302 and 1304. The bottom side layer is patterned with a mask layer (e.g., photoresist layer) 1310, which can be configured according to the size and shape of the cavity 130 to be formed. The cavity 130 is formed by an etching process, shown at 1312. For example, the etching process 1312 can be implemented as a TMAH etch process used in the same time and etch parameters as was used to form the cavity 118. Other etching techniques can also be used. In an example, the same mask used to form the photoresist mask layer 904 used to form the cavity 118 in FIG. 9 can be reused as a mask to form photoresist mask layer 1310 for forming the cavity 130.

Figure 15:
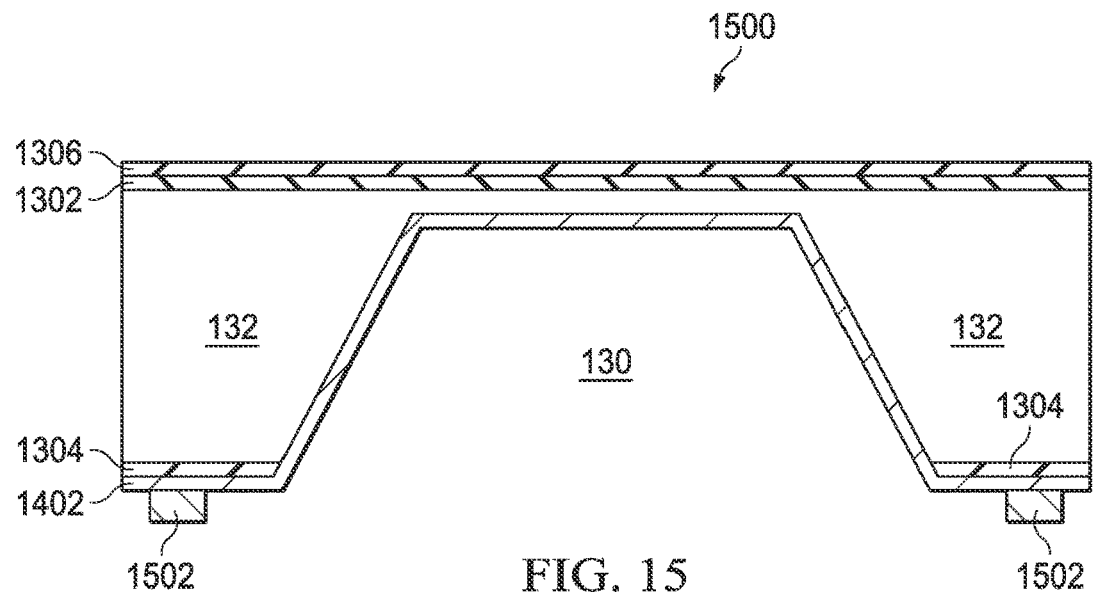

After forming the cavity 130 in FIG. 13, the backside nitride layer 1308 can be removed, and a metal layer 1402 can be applied by a deposition process shown at 1404. For example, the deposition process 1404 is the same as the deposition process 1002 shown with respect to FIG. 10. For example, the deposition at 1404 can be implemented as a blanket deposition to form a multilayer conductive layer 1402, such as including a titanium layer and a gold layer (e.g., about 30 nm Ti and about 1 µm Au). Other conductive materials can also be used to form the layer 1402. The resulting second wafer apparatus is shown at 1500 in FIG. 15. As shown in FIG. 15, a bond stack 1502 can be deposited over the metal layer 1402 along the periphery of the cavity 130. In other examples, the bond stack 1502 may be applied to the conductive layer 1000 surrounding the cavity 118 of the first wafer apparatus 1200 or be applied to respective surfaces of both substrates 112 and 132.

Figure 16:
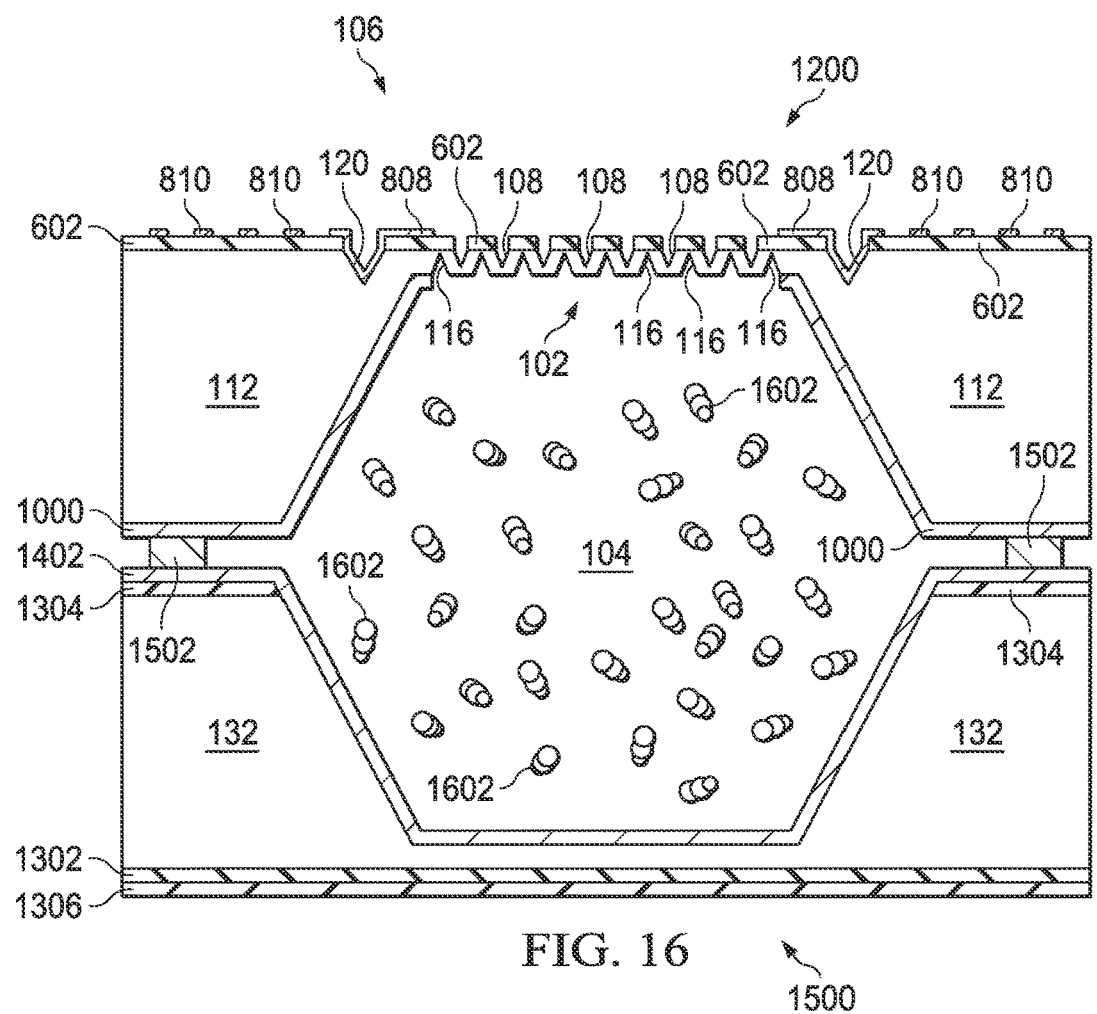

Returning to FIG. 5, at 512, the method 500 includes bonding the first and second substrates together to form a sealed cavity. FIG. 16 shows the resulting waveguide 106 that can be formed by bonding first and second wafer apparatus 1200 and 1500 together, in which the surfaces 114 and 136 are bonded together by the bond stack 1602 to provide the hermetically sealed cavity 104. In the example, of FIG. 16, the cavity 104 includes cavity portions formed in surface of both substrates 112 and 132. In other examples, the cavity 104 could be formed in only the substrate 112 or only the substrate 132. As shown in FIG. 16, the cavity 104 can be filled with a molecular gas, shown at 1602. As described herein, the periodic structures 108 and/or 116 can be configured to facilitate transmission of electromagnetic waves of a target wavelength (or target frequency or frequency range) into the cavity 104. The gas 1602 can be selected to absorb a target wavelength and transition between rotational states responsive to electromagnetic signals provided to the coupling interface 102 at the target wavelength.

Figure 17:
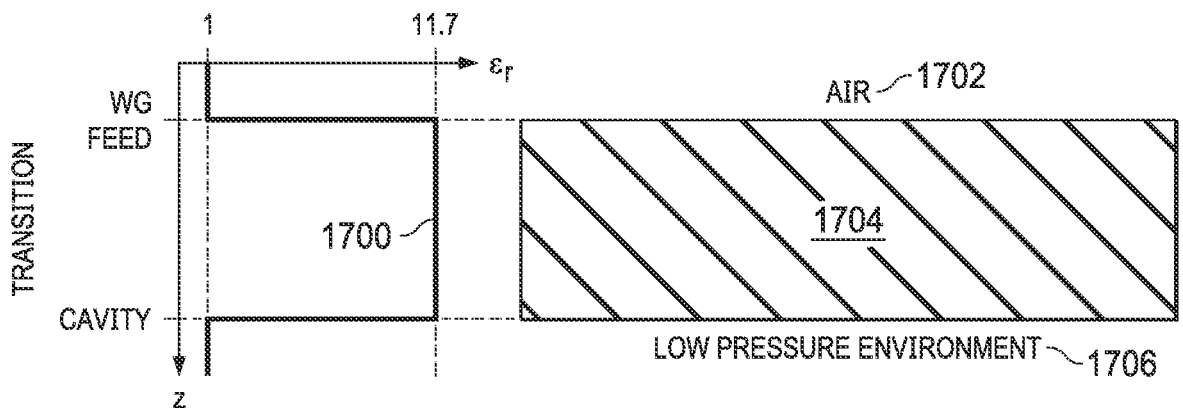
FIG. 17 is a schematic view showing effective dielectric permittivity when using an existing type of coupling interface for a transition into a waveguide cavity.
Figure 18:
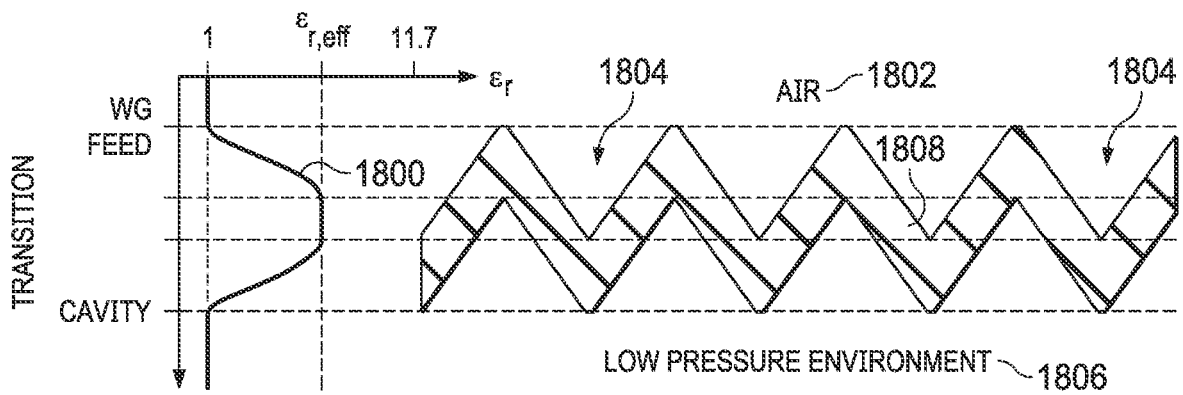
FIG. 18 is a schematic view showing effective dielectric permittivity when using an example embodiment of a coupling interface for a transition into a waveguide cavity.
Figure 19:
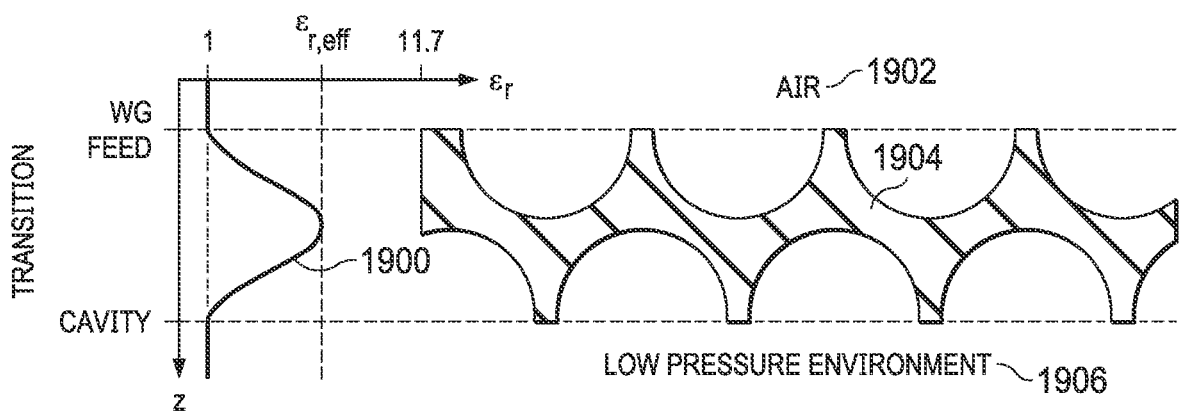
FIG. 19 is a schematic view showing effective dielectric permittivity when using another example embodiment of a coupling interface for a transition into a waveguide cavity.

FIGS. 17, 18 and 19 illustrate examples of dielectric permittivity for transitions between different configurations of coupling interfaces. For example, FIG. 17 shows a plot 1700 of dielectric permittivity for a transition into a waveguide cavity flowing from a region of air 1702 to glass coupling interface 1704 to a low pressure environment within a sealed cavity, shown at 1706. As a result of the transition not including the coupling interface with periodic structures, as described herein, there is an abrupt transition in the dielectric permittivity going from the region of air 1702 to the glass interface, such as stepping directly from 1 to 11.7. Similarly, there is an abrupt transition (e.g., from 11.7 to about 1) when going from glass region of interface 1704 to the low pressure environment 1706 within the cavity. The abrupt transition in dielectric permittivity creates large impedance mismatch for the electromagnetic wave traveling into the cavity and thus decreases transmission efficiency into the cavity 1706.

By contrast, FIG. 18 shows the transition going from the region of air 1802 to the silicon coupling interface configured, as described herein, shown at 1804, to a low pressure environment within a sealed cavity 1806. In the example of FIG. 18, the coupling interface 1804 includes periodic structures formed using an anisotropic etch, providing rectangular pyramidal shaped self-terminating periodic structures. FIG. 18 also shows a plot 1800 of dielectric permittivity for the transitions into the cavity 1806. As shown, there is a significant reduction in impedance mismatch for electromagnetic waves transitioning through the coupling interface 102 in addition to a reduction in the effective relative dielectric constant. Advantageously, the dielectric constant also exhibits a more gradual change at the transition between regions 1802 and 1804 as well as the transition between regions 1804 and 1806.

FIG. 19 shows a plot 1900 of dielectric permittivity for transitions from air 1902, through a coupling interface 1904 and into a low pressure environment within a sealed cavity 1906. In the example of FIG. 19, the coupling interface 1904 includes periodic structures formed using an isotropic etch, resulting in hemispherical shaped self-terminating periodic structures. As shown, there is a significant reduction in impedance mismatch for electromagnetic waves transitioning through the coupling interface 102 in addition to a reduction in the effective relative dielectric constant. Similar to the example of FIG. 18, the dielectric constant also exhibits a gradual change at the transition between regions 1902 and 1904 as well as the transition between regions 1904 and 1906.

Figure 20:
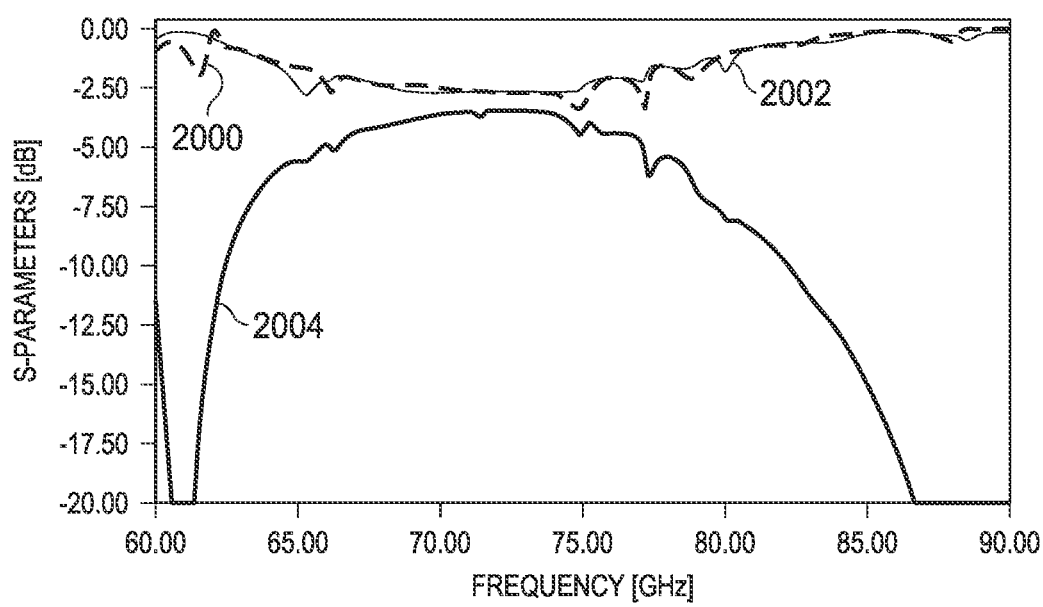
FIG. 20 is a graph showing radiofrequency performance an existing type coupling interface over a range of frequencies.
Figure 21:
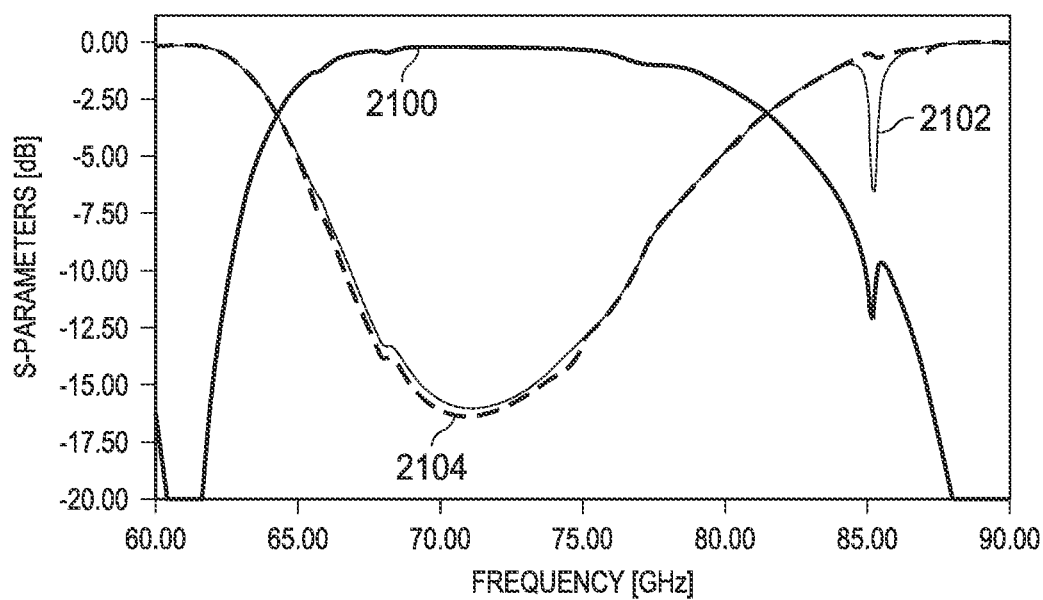
FIG. 21 a graph showing radiofrequency performance an example embodiment of a coupling interface over a range of frequencies.

FIGS. 20 and 21 illustrate additional comparative examples showing radiofrequency performance for an existing glass coupling interface over a range of frequencies.

FIG. 20 shows plots 2000 and 2002 showing reflection and return loss as a function of frequency for an electromagnetic wave transmitted through a glass coupling interface, such as the interface as described with respect to FIG. 17. FIG. 20 also shows the insertion loss 2004 over the same frequency range. The insertion loss exhibits about a −3.5 db value which results in significant inefficiencies of transmission of electromagnetic waves through a glass coupling interface into the cavity. By contrast, FIG. 21 shows a plot of insertion loss 2100 showing about −0.25 db of insertion loss for the coupling interface described herein. The insertion loss 2100 shows a significant efficiency improvement over the glass coupling shown in the plot 2004 of FIG. 20. Additionally, the insertion loss 2100 exhibits a flatter profile compared to the insertion loss 2004 shown in FIG. 20. FIG. 21 also include plots the reflection and return loss, shown at 2102 and 2104, respectively. In the example of FIG. 21, the coupling interface provided a return loss of approximately −15 dB, which is much lower than shown in FIG. 20 and demonstrates an extremely low reflected energy at the interface.

Figure 22:
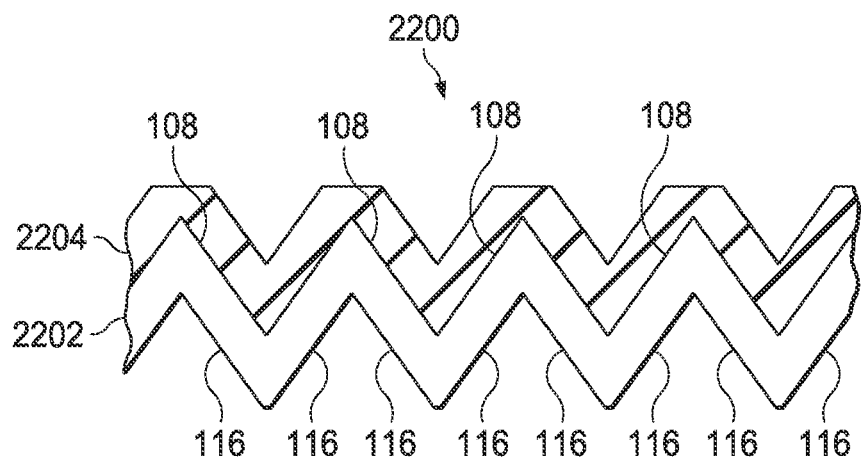
FIG. 22 is a side sectional view of an example coupling interface including a structural reinforcement layer.
Figure 23:
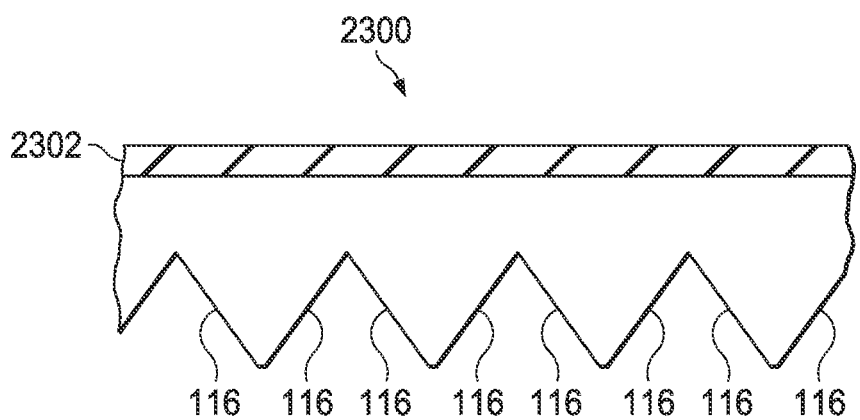
FIG. 23 is a side sectional view of an example coupling interface with a single-sided etch and an anti-reflective surface layer.
Figure 24:
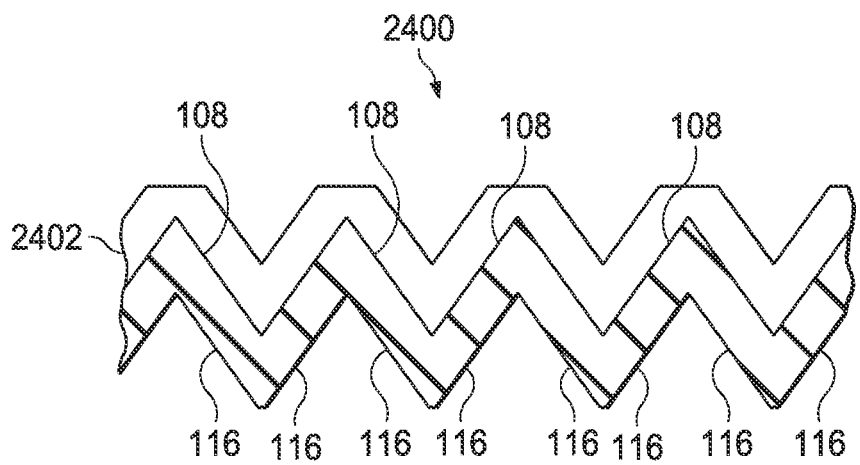
FIG. 24 is a side sectional view of an example coupling interface including a dielectric surface layer.

As described herein, various different configurations of the periodic structures may be implemented in a coupling interface 102, as described herein. FIGS. 22, 23, and 24 show some examples of different configurations of coupling interfaces, such as can be implemented in the coupling interface 102 shown in FIGS. 1-4 and 16.

Figure 12:
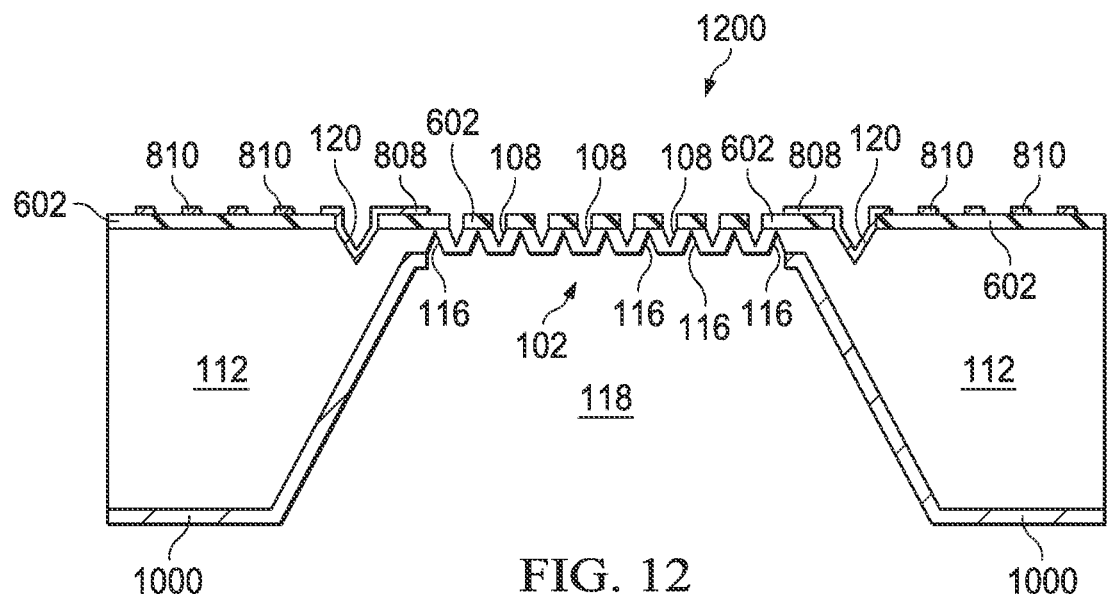

FIG. 22 shows a coupling interface 2200 similar to the examples of FIGS. 4 and 12 in that it includes interdigitated periodic structures 108 and 116 along both sides of the coupling interface 2200. Also, coupling interface 2200 includes a surface reinforcement layer 2202 applied to periodic structures on one of the side surfaces. For example, the surface reinforcement layer 2202 can be deposited (e.g., using CVD, such as PECVD) on the surface of the period structures 108. The reinforcement layer 2202 can be implemented as an oxide or nitride layer. The reinforcement layer 2202 can be configured to provide a default gas permeation rate with respect to the underlying layer that provides the periodic structures. Additionally, the nitride surface reinforcement layer 2204 also can provide increased structural stability over time. Moreover, by providing the reinforcement layer 2204, impedance mismatch between the inside and outside of the cavity and through the coupling interface 2200 can be further improved.

As mentioned, the periodic structures 108 or 116 can be formed on one or both sides of the coupling interface. FIG. 23 shows an example in which the coupling interface 2300 includes periodic structures 116 (e.g., formed only on an inner end surface 117 of the substrate). Thus, periodic structures are omitted from the opposite surface (e.g., surface 110). In the example of FIG. 23, the coupling interface 2300 includes an antireflective layer 2302 formed on the top surface 110 of the substrate.

FIG. 24 depicts another example of a coupling interface 2400 that includes periodic structures formed on both sides of the coupling interface, such as periodic structures 108 and 116. In the example of FIG. 24, a surface reinforcement layer 2402 of a dielectric material is formed over the top wafer surface 110 of the coupling interface 2400 where the periodic structures 108 have been formed. As an example, the layer 2402 can be formed using a spin on glass method, be printed over the surface or applied as a paralyne coating (e.g., using CVD, physisorption or polymerization). The surface of the layer 2402 can be smoothed, such as by using a chemical mechanical polishing or other similar process.

In this description, the term "couple" or "couples" means either an indirect or direct connection. Thus, if a first device couples to a second device, that connection may be through a direct connection or through an indirect connection via other devices and connections. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An apparatus comprising:
   a substrate including at least part of a cavity; and
   a layer over the substrate and covering the cavity, the layer including periodic structures, in which at least some of the periodic structures extend into the cavity.

2. The apparatus of claim 1, wherein the substrate includes a semiconductor substrate.

3. The apparatus of claim 1, wherein the periodic structures include sidewalls having a rectangular pyramidal or conical shape.

4. The apparatus of claim 1, wherein the periodic structures are first periodic structures on a first side of the layer facing away the cavity, the layer further comprising second periodic structures on a second side of the layer opposing the first side, in which the second periodic structures are interdigitated with the first periodic structures.

5. The apparatus of claim 1, further comprising recess structures along a periphery of the periodic structures.

6. The apparatus of claim 5, wherein the recess structures are first recess structures each extending a first depth into the substrate, the periodic structures comprise a two-dimensional array of periodic second recess structures each extending a second depth into the substrate, and the first depth is larger than the second depth.

7. The apparatus of claim 6, further comprising a conductive layer between the recess structures and the two-dimensional array of periodic structures.

8. The apparatus of claim 1, wherein substrate is a first substrate including a first portion of the cavity, and the apparatus comprises a second substrate coupled to the first substrate, the second substrate including a second portion of the cavity.

9. An apparatus comprising:
   a waveguide; and
   an interface including periodic structures, in which at least some of the periodic structures extend into the waveguide.

10. The apparatus of claim 9, wherein the at least some of the periodic structures include first periodic recess structures extending from an inner surface of the waveguide and second periodic recess structures extending from an outer surface of the waveguide.

11. The apparatus of claim 9, further comprising recess structures along a periphery of the interface.

12. The apparatus of claim 11, wherein the recess structures are first recess structures each extending a first depth into a wall of the waveguide, the periodic structures comprise a two-dimensional array of periodic second recess structures each extending a second depth into the wall, and the first depth is larger than the second depth.

13. The apparatus of claim 11, further comprising a conductive layer between the recess structures and the interface.

14. The apparatus of claim 13, further comprising an electromagnetic bandgap (EBG) structure between the recess structures and interface, and the conductive layer is part of the EBG structure.

15. The apparatus of claim 9, wherein the waveguide includes a cavity containing a gas.

16. The apparatus of claim 9, further comprising at least one of an anti-reflective coating or a reinforcement layer on the interface.

17. The apparatus of claim 9, wherein the interface and the waveguide are configurable to transmit a signal having a wavelength, and each of the periodic structures has a dimension smaller than the wavelength.

18. The apparatus of claim 7, further comprising an electromagnetic bandgap (EBG) structure between the recess structures and the two-dimensional array of periodic structures, and the conductive layer is part of the EBG structure.

19. The apparatus of claim 1, further comprising at least one of an anti-reflective coating or a reinforcement layer over the periodic structures.

20. The apparatus of claim 1, wherein the cavity is configurable as a waveguide.

21. The apparatus of claim 1, wherein the periodic structures are part of an interface.

22. The apparatus of claim 21, wherein the interface is configurable to transmit a signal having a wavelength, and each of the periodic structures has a dimension smaller than the wavelength.

23. The apparatus of claim 1, wherein the cavity contains a gas.

* * * * *